(12) United States Patent
Nitta

(10) Patent No.: US 6,597,113 B1
(45) Date of Patent: Jul. 22, 2003

(54) FLAT PANEL DISPLAY

(75) Inventor: Hideto Nitta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/531,436

(22) Filed: Mar. 20, 2000

(30) Foreign Application Priority Data

Mar. 18, 1999 (JP) ............................................ 11-073174

(51) Int. Cl.[7] .................................................. G09F 9/00
(52) U.S. Cl. ......................... 313/581; 313/48; 345/205
(58) Field of Search .................................. 313/582, 493, 313/495, 498, 48, 581, 422, 306, 312; 345/205, 206, 204; 349/150, 151, 152, 149; 315/169.3, 169.4

(56) References Cited

U.S. PATENT DOCUMENTS

| | | | |
|---|---|---|---|
| 4,039,890 A | * 8/1977 | Bailey et al. | 313/500 |
| 4,109,176 A | * 8/1978 | Ernsthausen et al. | 313/587 |
| 6,133,978 A | * 10/2000 | Tajima | 349/105 |
| 6,275,220 B1 | * 8/2001 | Nitta | 345/204 |

FOREIGN PATENT DOCUMENTS

| JP | 09-292624 | 11/1997 |
|---|---|---|
| JP | 10-260641 | 9/1998 |

* cited by examiner

Primary Examiner—Ashok Patel
(74) Attorney, Agent, or Firm—Sughrue Mion, PLLC

(57) ABSTRACT

A PDP flat panel display includes a front glass plate and a rear glass plate bonded to each other to form a number of display cells therebetween in a display area. Scan electrodes and sustain electrodes are formed on an inner, namely, rear surface of the front glass plate, and data electrodes are formed on an inner, namely, front surface of the rear glass plate. The rear glass plate includes an extension extending beyond the front glass plate, in an extending direction of the data electrodes. A heat dissipating conductor film is integrally formed on an inner, namely, front surface of the extension of the rear glass plate, and an integrated circuit chip of a driver integrated circuit for supplying a required voltage to the data electrodes is heat-conductively bonded on the heat dissipating conductor film.

20 Claims, 9 Drawing Sheets

FLAT PANEL DISPLAY

BACKGROUND OF THE INVENTION

The present invention relates to a flat panel display such as a plasma display panel (abbreviated to "PDP"), and more specifically to a flat panel display having an improved structure for mounting on a panel a driver IC (integrated circuit) for driving display cells.

A PDP is generally constituted of a front transparent plate (glass plate) and a rear transparent plate (glass plate) bonded to each other to interpose therebetween a partition for confining a number of display cells, a rare gas being sealed within a display cell space confined by the partition and the front and rear transparent plates. On the front glass plate, a number of transparent scan electrodes and transparent sustain electrodes are located in parallel to one another, and on the rear glass plate, a number of data electrodes are located in parallel to one another, orthogonally to the scan electrodes and the sustain electrodes. By applying respective predetermined voltages to these three kinds of cell electrodes at predetermined timings, an electric discharge is generated between the electrodes, so that ultraviolet is generated by the electric discharge, with the result that a phosphor coated in the display cells generates a visible light in response to the generated ultraviolet. In a color display, different phosphors for respectively generating three primary colors of red, green and blue, are used in different display cells, so that the display cells are selectively driven for light generation, with the result that a desired color image can displayed.

As mentioned above, in order to cause the PDP to emit light from the respective display cells, it is necessary to supply the voltages to the respective electrodes at predetermined timings. For this purpose, a driver IC is required to be integrally mounted in the PDP.

Referring to FIG. 8, there is shown a partially broken, diagrammatic perspective view of a PDP apparatus 200 including a PDP module 1 having driver ICs mounted thereon. A PDP 10 included in the PDP module 1, has a front glass plate 11 and a rear glass plate 12 bonded to each other, as mentioned above. A reinforcement plate 14 formed of for example aluminum is integrally mounted to a rear surface of the PDP 10. This reinforcement plate 14 mechanically reinforces the PDP 10, and also can be used as a mounting plate when the PDP module 1 is mounted within a casing 201, in order to constitute the PDP apparatus 200.

A display window 202 is formed in a front face of the casing 201, and a protection plate 203 formed of for example a transparent acrylic resin, is mounted on the display window. The driver ICs mounted on the PDP 10 are located at a periphery of the PDP 10, in such a manner that scan side driver ICs 3 connected to the scan electrodes and the sustain electrodes are mounted on one lateral side of the PDP 10, and data side driver ICs 2 connected to the data electrodes are mounted on an upper or a lower side of the PDP 10. These drivers ICs 2 and 3 are connected through a connector 204 fitted thereto to a not-shown control circuit and power supply, so that the drivers ICs 2 and 3 apply voltages supplied from the control circuit and power supply, to the respective electrodes.

Referring to FIG. 9A, there is shown a partial sectional view illustrating one example of a prior art mounting structure for mounting the data side driver IC 2 on the PDP 10, which is disclosed by Japanese Patent Application Preexamination Publication No. JP-A-10-260641. In this mounting structure, the data side driver IC 2 is constructed in the form of an IC package called a COF (chip on film), in which electrodes of an IC chip 40 are directly connected to an FPC (flexible printed circuit) 41, and a region including the:electrodes of the IC chip 40 is encapsulated with a resin 42. A back surface of the IC chip 40 is fixed by a heat conductive bonding agent 43 to a front face of an extension 14a of an aluminum reinforcement plate 14, outwardly projected from a periphery of the PDP 10 for protecting the glass plates 11 and 12 of the PDP 10. One end of the FPC 41 in the driver IC 2 is connected to a terminal 106a of the data electrodes formed on a front surface of the rear glass plate 12, and the other end of the FPC 41 is connected to an input printed circuit board 18 which is integrally-provided on a periphery of a front surface of the aluminum reinforcement plate 14. Incidentally, the reference number 19 designates a spacer inserted between the rear glass plate 12 and the aluminum reinforcement plate 14.

In addition, the above referred patent publication discloses another mounting structure shown in FIG. 9B, in which the IC chip 40 of the driver IC of the COF structure is mounted on a rear surface of the aluminum reinforcement plate 14. The FPC 41 is bent to extend over the peripheral edge of the aluminum reinforcement plate 14 so as to reach the rear surface of the periphery of the aluminum reinforcement plate 14, as shown in FIG. 9B. A front side end of the FPC 41 is connected to the terminal 106a of the data electrode formed on the front surface of the rear glass plate 12, and a rear side end of the FPC 41 is connected to the input printed circuit board 18 which is integrally provided on a rear surface of the aluminum reinforcement plate 14.

The above mentioned prior art mounting structures can be said to have been designed to pay importance to heat dissipation of the IC chip 40. Namely, as described in the above referred patent publication, in the color PDP, the heat generation of the driver IC 2 becomes remarkable because a load of the driver IC 2 increases with microminiaturization and the high density of the display cells. Therefore, it has become important to elevate the heat dissipation of the driver IC 2. By mounting the driver IC on the aluminum reinforcement plate 14 to cause the heat generated in the IC chip 40 to be immediately transferred to the aluminum reinforcement plate 14 and to be dissipated from a surface of the aluminum reinforcement plate 14, the above mentioned prior art mounting structure is intended to elevate the heat dissipation. On the other hand, in the prior art mounting structure shown in FIG. 9B proposed in the above referred patent publication for downsizing the PDP, by mounting the IC chip 40 on the rear surface of the aluminum reinforcement plate 14, it becomes unnecessary to extend the periphery of the aluminum reinforcement plate 14 outwardly from the periphery of the PDP 10, with the result that an outer scale of the PDP module is reduced.

The above mentioned mounting structures, however, since the IC chip 40 formed of a semiconductor such as silicon is directly fixed to the aluminum reinforcement plate 14 having a thermal expansion coefficient which is different from that of the semiconductor by one or more order of magnitude, when the driver IC 2 operates, a large heat stress acts on the IC chip 40 because of difference in heat expansion between the IC chip 40 and the aluminum reinforcement plate 14 caused by the heat generated in the IC chip 40, with the result that a crack occurs in the IC chip 40, so that reliability of the driver IC 2 lowers, and therefore, reliability of the PDP module 1 drops.

In the above mentioned mounting structures, furthermore, it is inevitable that the size of the PFC 41 in the COF structure, particularly, the length in a signal transmission direction from a signal input side to the terminal of the data electrode becomes long. Namely, in the mounting structure shown in FIG. 9A, since the IC chip 40 is fixed to the extension 14a of the aluminum reinforcement plate 14 extending outwardly from the periphery of the PDP 10, the FPC 14 is bent in a thickness direction by a step difference corresponding to a thickness of the rear glass plate 12, from the front surface of the rear glass plate 12 on which the terminals 106 of the data electrodes are formed, to the surface of the electrodes of the IC chip 40. However, since the FPC 41 is formed of a sheet formed of a resin such as polyimide and a circuit pattern of thin metal film integrally formed on the resin sheet, the FPC 41 cannot be bent with a small bend radius in a thickness direction. Therefore, a predetermined length is required for ensuring a necessary bending amount of the FPC 41. Furthermore, since the other end of the FPC 41 is connected to the input printed circuit board 18 which is then connected to an external circuit, the FPC 41 is required to have a length required to be connected to the input printed circuit board 18 and to allow the input printed circuit board 18 to be mounted on the FPC 41. On the other hand, in the structure shown in FIG. 9B, since the FPC 41 is bent to extend from the front surface and to reach the rear surface of the aluminum reinforcement plate 14, the FPC 41 becomes extremely long.

If the FPC 41 becomes long as mentioned above, the drive IC 2 becomes large in size, and the extension 14a of the aluminum reinforcement plate 14 correspondingly becomes long, with the result that the size of the PDP module 1 becomes large. In addition, since the FPC 41 is more expensive than a conventional printed circuit board, the cost of the driver IC 2 becomes high in proportion to an increase in the length of the FPC 41. In particular, in the color PDP intended to microminiaturize the display cells so as to increase the display cell density, the number of driver ICs 2 is inclined to increase more or more. If the number of driver ICs 2 incorporated in the PDP module 1 increases, the whole cost of the PDP module increases unneglectfully.

BRIEF SUMMARY OF THE INVENTION

Accordingly, it is an object of the present invention to provide a flat panel display which has overcome the above mentioned problem of the prior art.

Another object of the present invention is to provide a flat panel display having an elevated heat dissipation effect of the driver ICs to elevate reliability of the driver ICs and having a reduced size and a lowered cost.

Still another object of the present invention is to provide a PDP apparatus having an elevated heat dissipation effect of the driver ICs to elevate reliability of the driver ICs and having a reduced size and a lowered cost.

The above and other objects of the present invention are achieved in accordance with the present invention by a flat panel display including a number of display cells formed and arranged on a transparent plate, wherein a driver integrated circuit for driving the display cells are tightly mounted on the transparent plate.

In an embodiment of the flat panel display, the transparent plate includes a display area where the display cells are formed and an extension extending outwardly from the display area, the driver integrated circuit being tightly mounted on the extension of the transparent plate. The driver integrated circuit includes a flexible printed circuit and an integrated circuit chip mounted on the flexible printed circuit, the integrated circuit chip including electrodes formed on an upper surface thereof and connected to the flexible printed circuit, a rear surface of the integrated circuit chip being tightly mounted on the transparent plate. In this case, cell electrodes for supplying a voltage to the display cells are formed on one surface of the transparent plate, and the driver integrated circuit is mounted on the one surface of the transparent plate and electrically connected to the cell electrodes through the flexible printed circuit.

In a preferred embodiment, a heat dissipating conductor film is integrally formed on the one surface of the transparent plate, and the integrated circuit chip is bonded on the heat dissipating conductor film. The heat dissipating conductor film can be formed of the same conducting film as that of the cell electrodes. In addition, a metal reinforcement plate can be backed to the transparent plate, the heat dissipating conductor film being heat-conductively coupled to the metal reinforcement plate through a heat conducting member.

Specifically, the transparent plate is constituted of a first glass plate of a pair of glass plates which are bonded to each other to constitute a plasma display panel, the driver integrated circuit being mounted on a portion of a surface of the first glass plate opposing to a second glass plate of the pair of glass plates. Preferably, the second glass plate is a front glass plate on which scan electrodes and sustain electrodes are formed as the cell electrodes, and the first glass plate is a rear glass plate on which data electrodes are formed as the cell electrodes. At least one end of the rear glass plate in an extending direction of the data electrodes has an extension extending beyond the front glass plate, and a driver integrated circuit for supplying a required voltage to the data electrodes is mounted on the extension of the rear glass plate. In addition, the driver integrated circuit can be packaged on the flexible printed circuit in the form of a tape carrier package structure or in the form of a chip on film structure.

With the above mentioned arrangement, since the driver integrated circuit is tightly mounted on the surface of the transparent plate such as the glass plate, when heat generates in the integrated circuit chip, a heat stress is suppressed, since the difference in thermal expansion coefficient between the semiconductor such as silicon constituting the integrated circuit chip and the glass plate is smaller, with the result that a crack is prevented from occurring in the integrated circuit chip. Since the integrated circuit chip is mounted on the surface of the transparent plate where cell electrodes are formed, the difference in height between the electrode surface of the integrated circuit chip and the cell electrode surface is reduced, so that the bending amount of the flexible printed circuit in the thickness direction can be minimized, and the size of the flexible printed circuit can be shortened. Therefore, the driver integrated circuit can be microminiaturized and the cost of the driver integrated circuit can be lowered. Since the heat generated in the driver integrated circuit can be effectively dissipated through the heat dissipating patterned conductor formed on the transparent plate, an overheating of the driver integrated circuit can be presented, and therefore, reliability of the driver integrated circuit can be elevated.

Japanese Patent Application Pre-examination Publication No. JP-A-09-292624 discloses a liquid crystal display apparatus in which a driver IC of the TCP (tape carrier package) structure is mounted on a glass plate of the liquid crystal display. This structure can be adopted because the heat generation of the driver IC in the liquid crystal display is remarkably small in comparison with that of the driver IC in the plasma display panel. Therefore, when this structure was applied to the plasma display panel with no modification, since the heat generation of the driver IC is remarkably large, the above mentioned problem cannot be satisfactorily overcome. JP-A-09-292624 also proposes that electrodes of an IC chip in the driver IC is connected to electrodes formed on the glass plate, by an anisotropic electrically conductive bonding agent. However, it is difficult to effectively transfer the heat generated in the IC chip through the anisotropic electrically conductive bonding agent to the glass plate. Even in this point, the above mentioned problem cannot be satisfactorily overcome by applying the technique disclosed in JP-A-09-292624 to the plasma display panel.

The above and other objects, features and advantages of the present invention will be apparent from the following description of preferred embodiments of the invention with reference to the accompanying drawings.

DETAILED DESCRIPTION OF THE INVENTION

Figure 1:
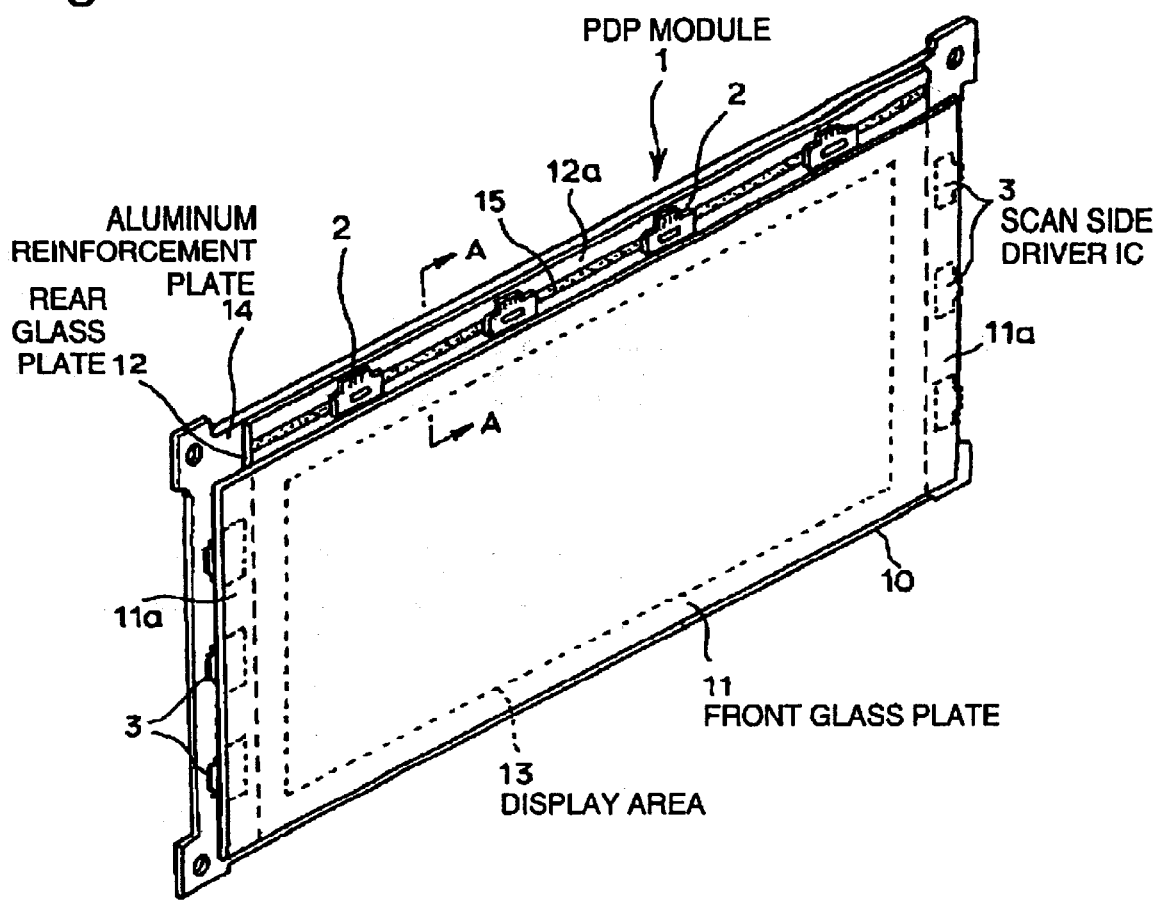
FIG. 1 is a diagrammatic perspective view of a PDP module in a first embodiment of the plasma display panel apparatus in accordance with the present invention.

Referring to FIG. 1, there is shown a diagrammatic perspective view of a PDP module in a first embodiment of the plasma display panel apparatus in accordance with the present invention.

Similarly to the prior art, a PDP 10 included in a PDP module 1 includes a front glass plate 11 and a rear glass plate 12 bonded to each other to leave a space therebetween, so that a number of display cells are arranged between the glass plates to form a display area 13. An aluminum reinforcement plate 14 is mounted on a rear surface of the rear glass plate 12.

Figure 2:
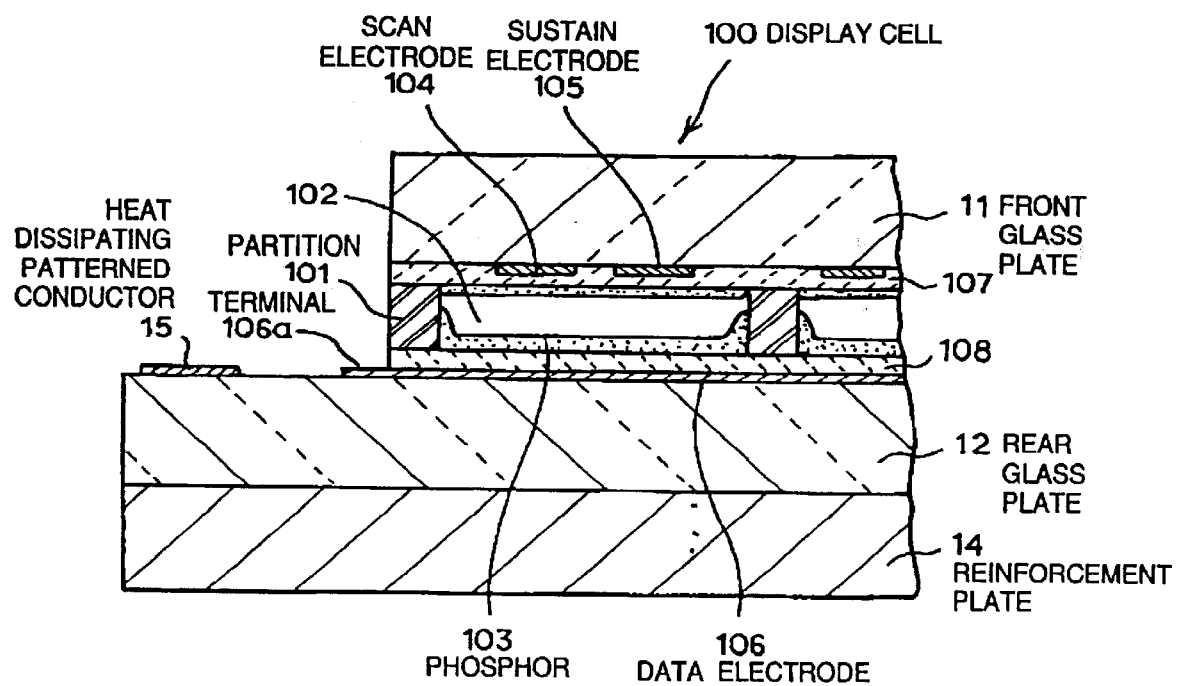
FIG. 2 is a partial sectional view, taken along the line A—A in FIG. 1.

Specifically, as shown in FIG. 2 which is a partial sectional view, taken along the line A—A in FIG. 1, the front glass plate 11 and the rear glass plate 12 are bonded to each other to sandwich therebetween a partition 101 for confining a number of display cells 100. A rare gas is sealed within a display cell chamber 102 confined by the partition and the front and rear transparent plates. A phosphor 103 for a different color such as red, green and blue, is coated on an inner surface of each display cell chamber 102. Furthermore, a scan electrode 104 and a sustain electrode 105 formed of a transparent electrode material are located on an inner surface of the front glass plate 11, and a data electrode 106 is located on an inner surface of the rear glass plate 12. These electrodes are coated with dielectric films 107 and 108, respectively. Here, all of the scan electrodes 104, the sustain electrode 105 and the data electrodes 106 will be called a "cell electrode" in this specification.

Here, viewing a vertical direction of the PDP 10, a vertical length of the rear glass plate 12 is longer than that of the front glass plate 11 so that an upper edge of the rear glass plate 12 extends beyond an upper edge of the front glass plate 11 by a predetermined length, to form an extension 12a. On the other hand, viewing a horizontal direction of the PDP, a horizontal length of the front glass plate 11 is longer than that of the rear glass plate 12 so that each of opposite side edges of the front glass plate 11 extends beyond a corresponding side edge of the rear glass plate 12 by a predetermined length, to form an extension 11a.

Of the scan electrodes 104, the sustain electrode 105 and the data electrodes 106 extending on the inner surface of the glass plates 11 and 12, respective extensions 106a of the data electrodes 106 are arranged along a horizontal direction of the rear glass plate 12 on a front surface of the extension 12a of the rear glass plate 12 which extends beyond the front glass plate 11 in an upper edge of the PDP 10. Similarly, but although not shown, respective extensions of the scan electrodes 104 and the sustain electrodes 105 are arranged on a rear surface of the extension 11a of the front glass plate 12 which extends beyond the rear glass plate 12 in opposite side edges of the PDP 10.

The aluminum reinforcement plate 14 integrally mounted on a rear surface of the rear glass plate 12 as mentioned above, has an outer size substantially equal to that of the rear glass plate 12. On the upper edge extension 12a of the rear glass plate 12, a plurality of data side driver ICS 2 connected to the data electrodes 106 are mounted at predetermined intervals. On the opposite side edge extensions 11a of the front glass plate 11, a plurality of scan side driver ICs 3 connected to the scan electrodes and the sustain electrodes are mounted at predetermined intervals. Thus, the PDP module 1 is constituted.

Figure 3:
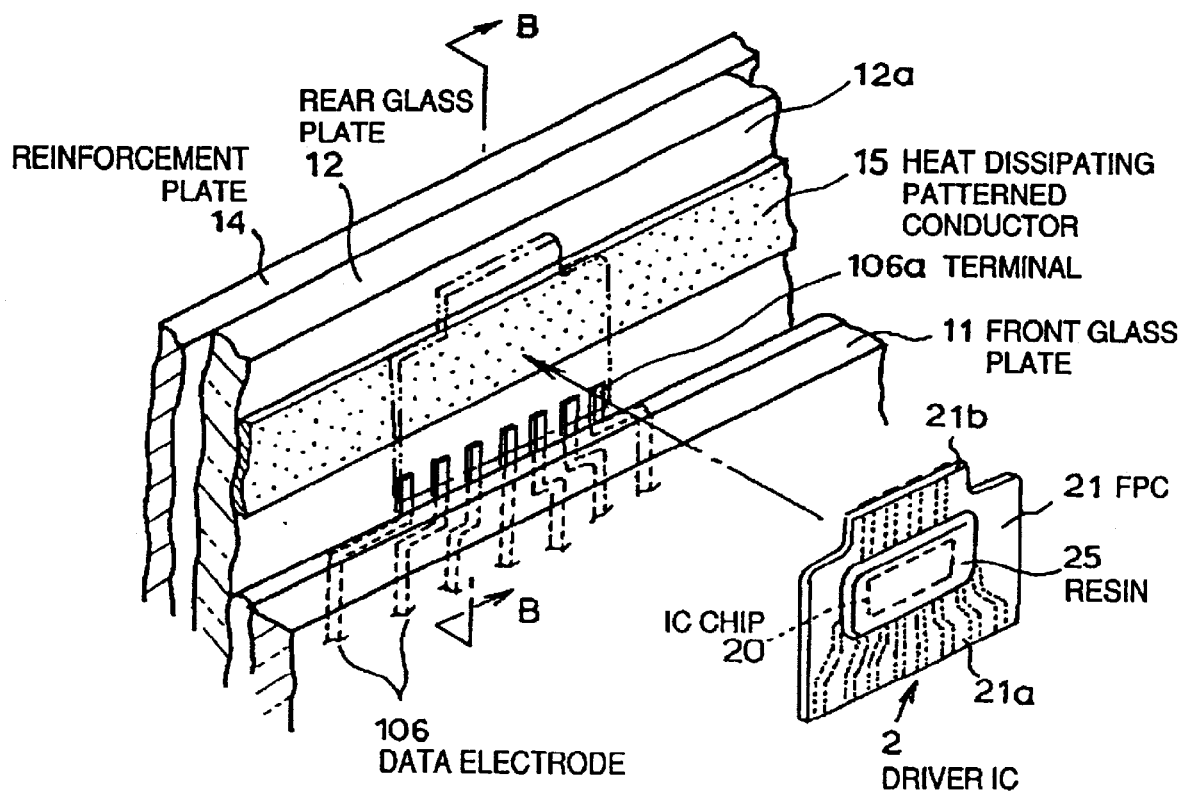
FIG. 3 is a diagrammatic exploded partial perspective view of a driver IC mounting structure in the PDP module shown in FIG. 1.
Figure 4:
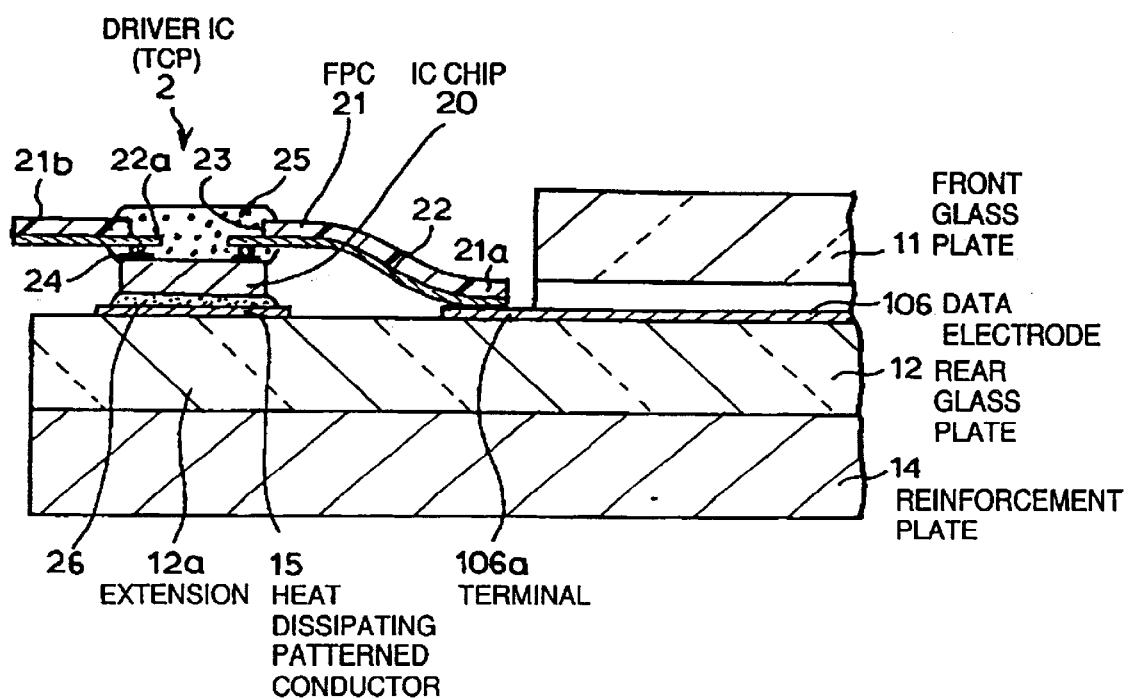
FIG. 4 is a partial sectional view taken along the line B—B in FIG. 3.

Referring to FIG. 3, there is shown a diagrammatic exploded partial perspective view of a mounting structure of the data side driver IC 2 for driving the data electrodes 106. FIG. 4 is a partial sectional view taken along the line B—B in FIG. 3.

In this embodiment, the data side driver IC (simply called a "driver IC" hereinafter) 2 is constituted in the form of an IC package of a TCP (tape carrier package) structure, in which an IC chip 20 is mounted on a FPC 21. This TCP structure includes a conductor pattern 22 of a thin metal film formed on an inner surface of a flexible insulating sheet constituting the FPC 21. The IC chip 20 is positioned to face an aperture 23 formed in the FPC 21, and electrodes of the IC chip 20 are bonded to inner leads 22a of the conductor pattern 22 projecting into the aperture 23, by a face-down boding by use of a bump 24 or the like. Furthermore, a resin 25 is applied to encapsulate the aperture 23 or an electrode side surface of the IC chip 20. On one end 21a of the FPC 21, electrode side terminals of the conductor pattern 22 are located at a pitch corresponding to a location pitch of the terminals 106s of the data electrodes 106. On the other end 21b of the FPC 21, connector side terminals of the conductor pattern 22 are located to be connected to a not-shown connector.

As mentioned above, the terminals 106a of the data electrodes 106 are located in an exposed condition on the front surface of the extension 12a of the rear glass plate 12. In addition, a heat dissipating patterned conductor 15 is formed on the front surface of the extension 12a, separately from the terminals 106a of the data electrodes 106 by a short distance, in the form of a band continuously extending along the periphery of the rear glass plate 12. This heat dissipating patterned conductor 15 can be formed of the same material as that of the data electrodes 106, as the same time as the data electrodes 106 are formed on the rear glass plate 12. The driver IC 2 in the TCP structure is fixed to the rear glass plate 12, by tightly bonding a rear surface of the IC chip 20 to a surface of the heat dissipating patterned conductor 15 by use of a bonding agent such as an Ag paste or a solder, having a high heat conductivity. In addition, the electrode side terminals on the one end 21a of the FPC 21 are connected to the terminals 106a of the data electrodes 106. On the other hand, the other end 21b of the FPC 21 extends in parallel to the surface of the rear glass plate 12, separately from the surface of the rear glass plate 12 by a short distance, because of stiffness of the FPC itself.

With the above mentioned arrangement, since the driver IC 2 is tightly mounted on the front surface of the rear glass plate 12 where there are formed the terminals 106a of the data electrodes 106 to be connected to the driver IC, when the driver IC 2 is operated to generate heat from the IC chip 20, since the difference in thermal expansion coefficient between the semiconductor such as silicon constituting the IC chip 20 and a glass constituting the rear glass plate is smaller than the difference in thermal expansion coefficient between the semiconductor and the metal (aluminum reinforcement plate), a heat stress acting on the IC chip 20 is suppressed, with the result that a crack is prevented from occurring in the IC chip 20, so that reliability of the driver IC 2 and the PDP module 1 can be elevated.

Furthermore, since the IC chip 20 is mounted on the same surface as that of the extension 106a of the data electrodes 106 on the front surface of the rear glass plate 12, a difference in height between the electrode side surface of the IC chip 20 and the terminals 106a of the data electrode becomes as small as the thickness of the IC chip 20. Therefore, when the electrode side terminals on the one end 21a of the FPC 21 are connected to the terminals 106a of the data electrodes 106, it is no longer necessary to greatly bend the FPC 21 in a thickness direction. Accordingly, even if the IC chip 20 is fixed on a position near to the terminals 106a of the data electrodes 106 so as to shorten the length of the FPC 21 used for connecting between the IC chip 20 and the terminals 106a of the data electrodes 106, a satisfactory connection can be obtained. Thus, it becomes possible to shorten the size of the FPC 21, with the result that the driver IC 2 can be microminiaturized and the cost of the driver IC 2 can be lowered. Furthermore, with the shortened size of the FPC 21, it is possible to correspondingly reduce the length of the extension 12a of the rear glass plate 12 to a length near to the size of the driver IC 2. Therefore, even if the extension 12a is provided at the upper edge of the rear glass plate 12, it is possible to minimize the enlargement of the size of the PDP 10 and hence the PDP module 1.

Moreover, since the IC chip 20 is tightly bonded to the heat dissipating patterned conductor 15 formed on the rear glass plate 12, the heat generated in the IC chip 20 is immediately transferred to the heat dissipating patterned conductor 15, so that the heat is dissipated from the surface of the heat dissipating patterned conductor 15 while conducting through the heat dissipating patterned conductor 15. Particularly, since the heat dissipating patterned conductor 15 is formed in the form of a band continuously extending along the periphery of the rear glass plate 12, the heat is effectively dissipated from an exposed surface of the heat dissipating patterned conductor 15 between the plurality of driver ICs 2, and therefore, it is possible to elevate a cooling effect for the driver ICs 2.

Figure 5:
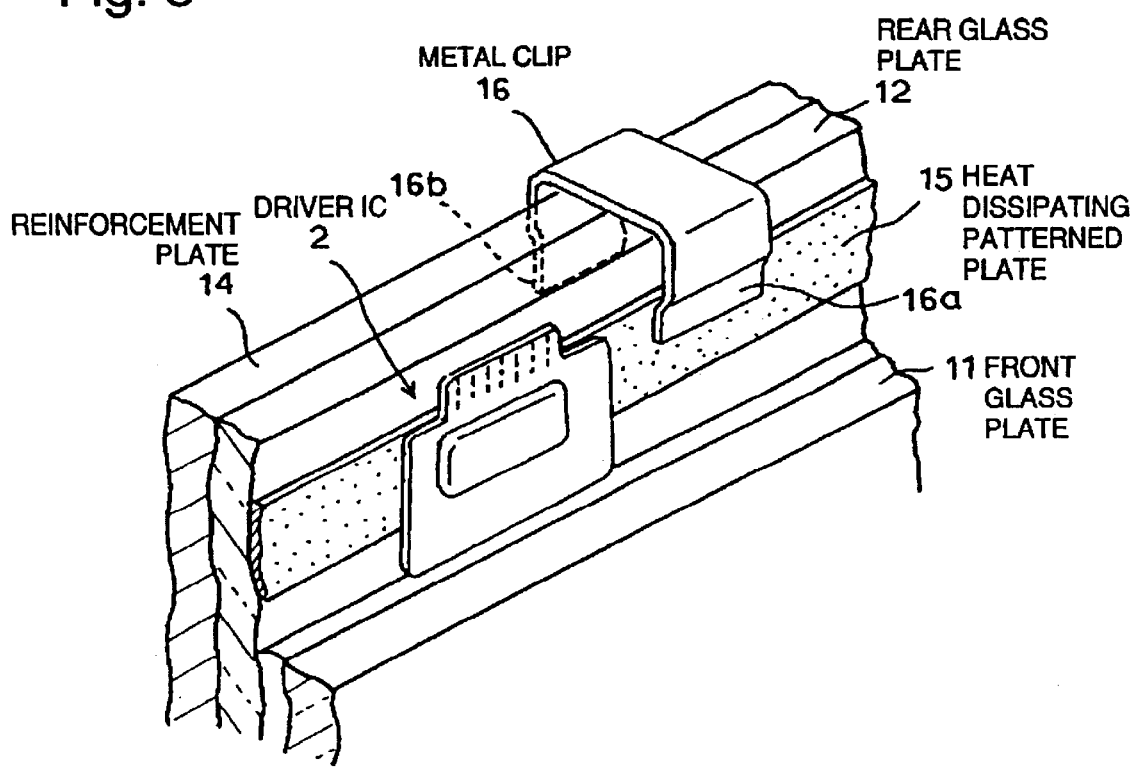
FIG. 5 is a diagrammatic partial perspective view of a modification of the heat dissipation structure in the plasma display panel apparatus in accordance with the present invention.

For example, in order to elevate the heat dissipating effect of the heat dissipating patterned conductor 15, it is possible to fit a metal clip 16 of a C-shape over an edge of a stacked assembly consisting of the rear glass plate 12 and the aluminum reinforcement plate 14, as shown in FIG. 5, so that one end 16a of the metal clip 16 is brought into contact with the surface of the heat dissipating patterned conductor 15, and the other end 16b of the metal clip 16 is brought into contact with the aluminum reinforcement plate 14. In this case, the heat in the beat dissipating patterned conductor 15 can be transferred to the aluminum reinforcement plate 14, so that the heat is effectively dissipated from a rear surface of the aluminum reinforcement plate 14.

Figure 6:
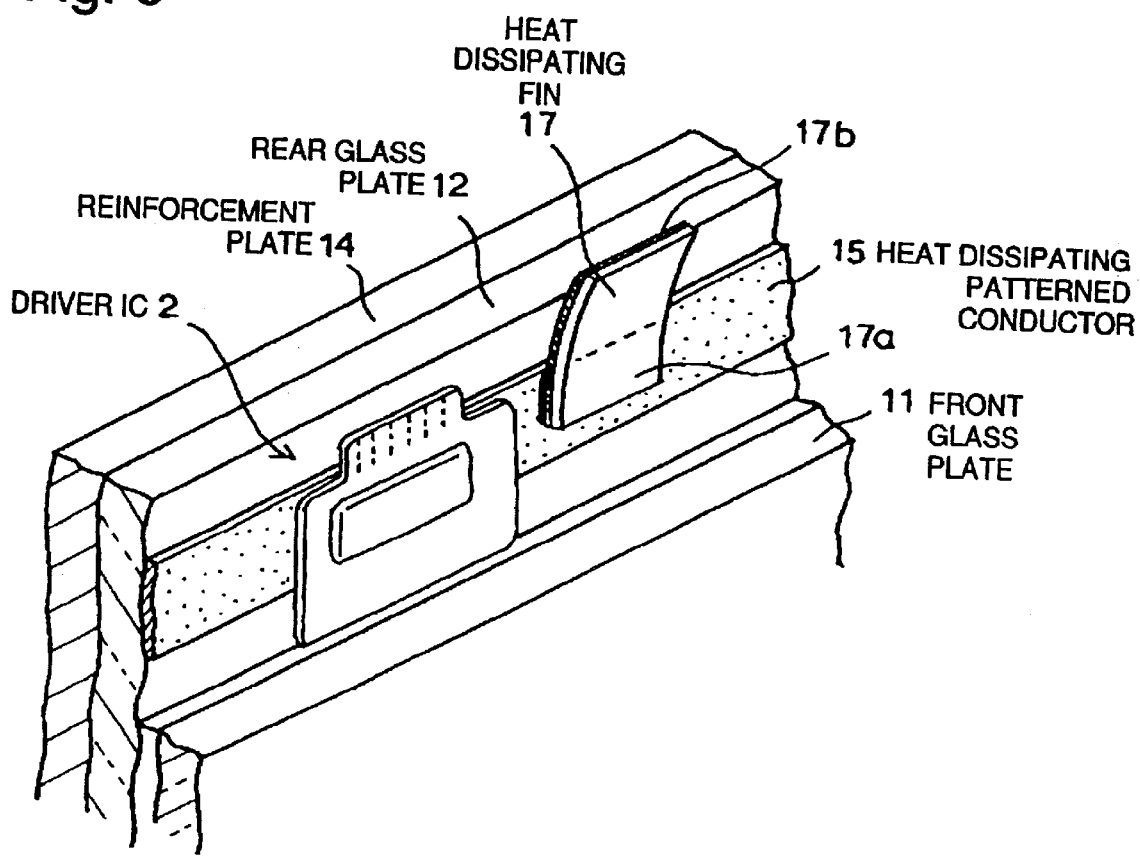
FIG. 6 is a diagrammatic partial perspective view of another modification of the beat dissipation structure in the plasma display panel apparatus in accordance with the present invention.

Alternatively, as shown in FIG. 6, a heat dissipating fin 17 formed of a flexible metal sheet, for example, an inexpensively available FPC having no circuit pattern, is provided on an exposed position of the heat dissipating patterned conductor 15 between the driver ICs 12, in such a manner that one end 17a of the heat dissipating fin 17 (one end of the metal film of the FPC) is heat-conductively fixed to the heat dissipating patterned conductor 15 and the other end 17b of the heat dissipating fin 17 constitutes a free end projecting from the periphery of the rear glass plate 12. In this case, the heat transferred from the driver IC 2 to the heat dissipating patterned conductor 15 can be transferred to the metal film of the FPC constituting the heat dissipating fin 17, so that the heat is effectively dissipated from a free surface of the metal film of the FPC.

In the above explanation, the mounting structure for the data side driver IC 2 has been described. However, it would be a matter of course to persons skilled in the art that a similar mounting structure can be adopted for the scan side driver IC 3. In this case, although not shown, it is sufficient if the scan side driver ICs 3 are mounted on a rear surface of the extension 11a of the front glass plate 11 which extends beyond the periphery of the rear glass plate 12 and where respective ends of the scan electrodes 104 and the sustain electrodes 105 are located, and then electrically connected to the respective ends of the scan electrodes 104 and the sustain electrodes 105.

Figure 7:
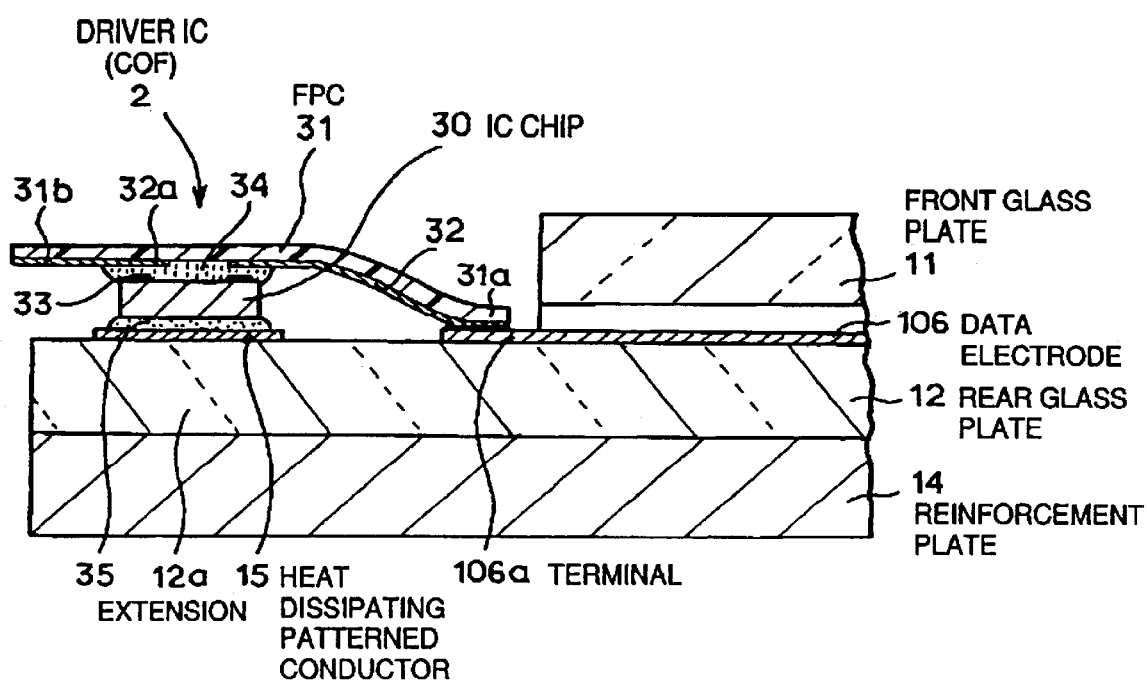
FIG. 7 is a partial sectional view of an essential portion of the driver IC mounting structure, for illustrating a second embodiment of the plasma display panel apparatus in accordance with the present invention.
Figure 8:
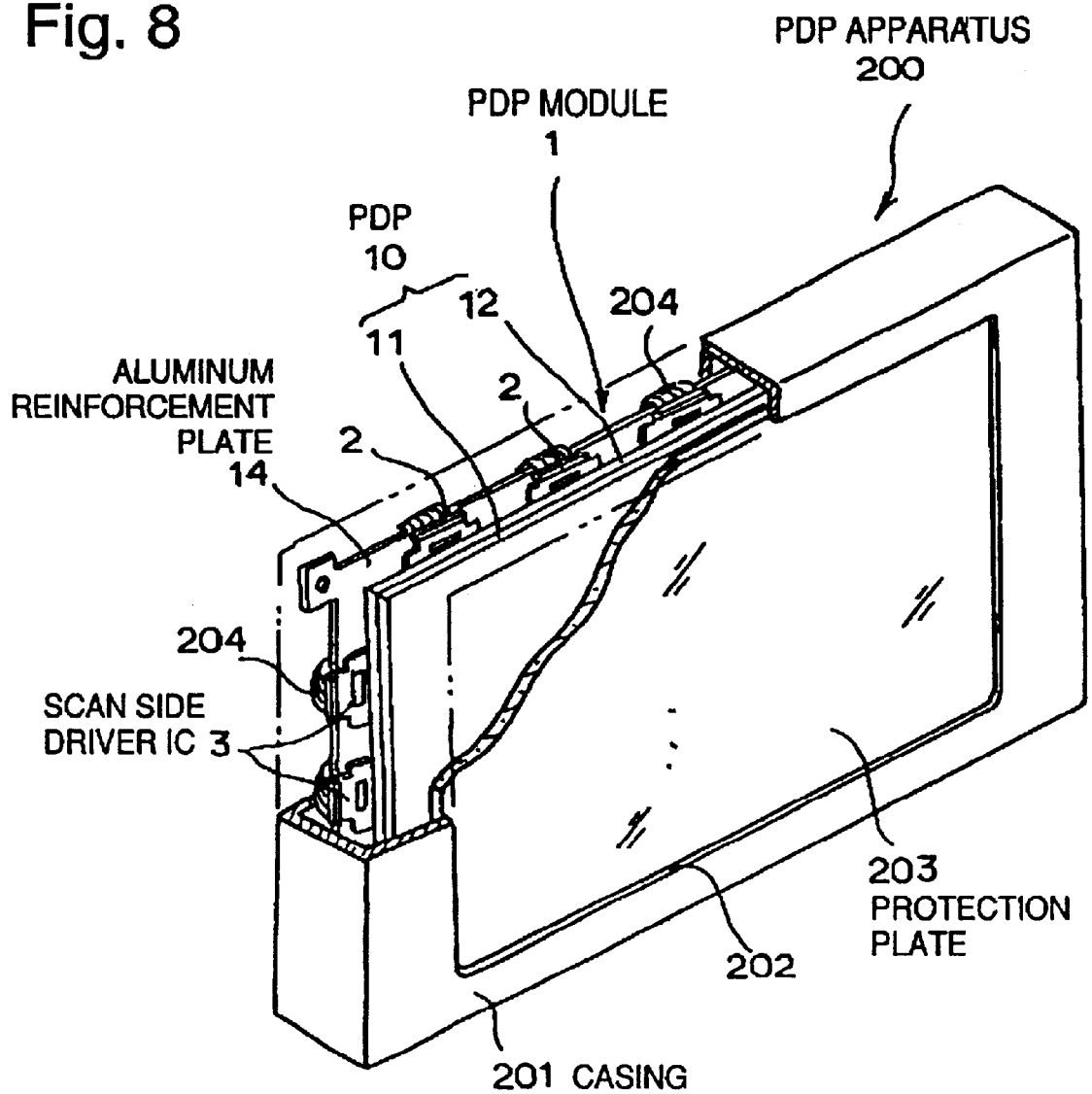
FIG. 8 is a partially broken, diagrammatic perspective view of a prior art plasma display panel apparatus.
Figure 9A:
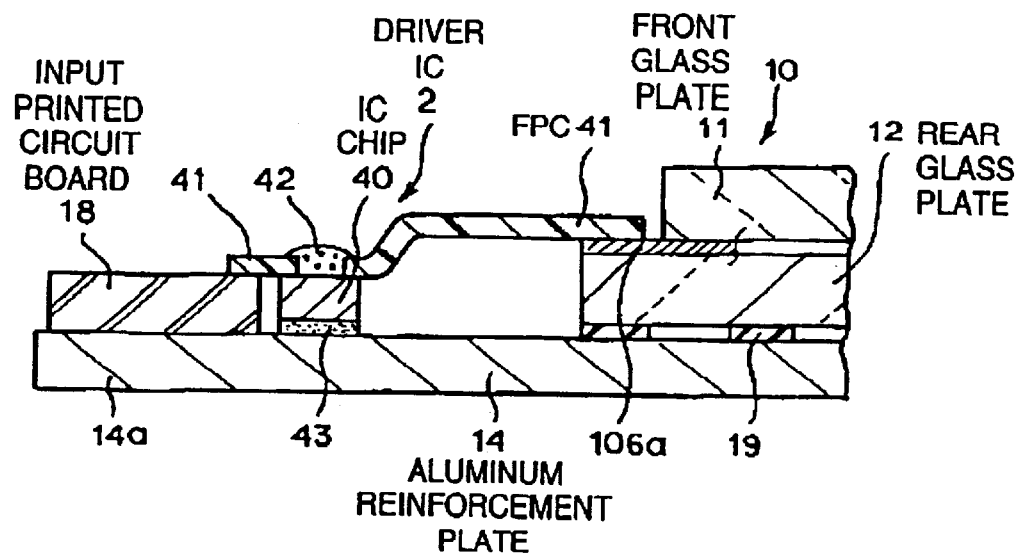
FIGS. 9A and 9B are partial sectional views illustrating two examples of a driver IC mounting structure in the prior art plasma display panel apparatus.
Figure 9B:
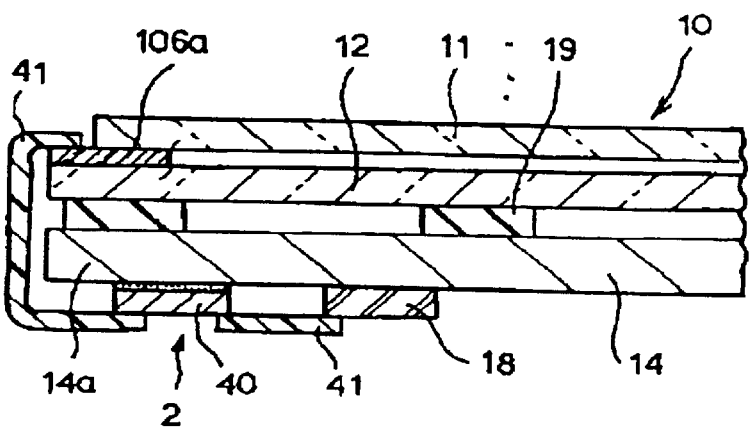

Referring to FIG. 7, there is shown a view similar to FIG. 4, but for illustrating a second embodiment of the plasma display panel apparatus in accordance with the present invention. In FIG. 7, elements corresponding to those shown in FIG. 4 are given the same reference numbers, and explanation will be omitted.

In this second embodiment, the driver IC 2 is constituted in the form of an IC package of the COF structure. An FPC 31 includes a conductor pattern 32 formed on an inner surface thereof to constitute a required wiring circuit. An IC chip 30 is positioned so that electrodes of the IC chip 30 face pads 32a of the conductor pattern 32, and the electrodes of the IC chip 30 are electrically connected to the pads 32a of the conductor pattern 32, by an anisotropic electrically conductive bonding agent 34 which are applied to fill up a space between the FPC 31 and the IC chip 30. Thus, the IC package is completed.

Similarly to the first embodiment, the driver IC 2 of the COF structure is fixed to the rear glass plate 12, by tightly bonding a rear surface of the IC chip 30 to the heat dissipating patterned conductor 15 formed on the front surface of the extension 12a of the rear glass plate 12, by use of a bonding agent such as an Ag paste or a solder, having a high heat conductivity. In addition, electrode side terminals of the conductor pattern 32 on one end 31a of the FPC 31 are connected to the terminals 106a of the data electrodes 106. On the other hand, terminals of the conductor pattern 32 on the other end 31b of the FPC 31 constitutes connector side terminals, and the other end 31b of the FPC 31 extends in parallel to the surface of the rear glass plate 12, separately from the surface of the rear glass plate 12 by a short distance, because of stiffness of the FPC itself.

In this second embodiment, since the driver IC 2 of the COF structure is tightly mounted on the front surface of the rear glass plate 12 where there are formed the terminals 106A of the data electrodes 106 to be connected to the driver IC, similarly to the first embodiment, when heat is generated from the IC chip 30, a crack is prevented from occurring in the IC chip 30, so that reliability of the driver IC 2 and the PDP 10 can be elevated. Furthermore, since the IC chip 30 is mounted on the same surface as that of the extension 106a of the data electrodes 106 on the front surface of the rear glass plate 12, it is no longer necessary to greatly bend the FPC 31 in a thickness direction, and therefore, it is possible to shorten the length of the FPC 31. Therefore, the driver IC 2 can be microminiaturized and the cost of the driver IC 2 can be lowered. Since the IC chip 30 is tightly bonded to the heat dissipating patterned conductor 15 formed of the rear glass plate 12, it is possible to elevate a cooling effect for the driver ICs 2 by a heat dissipation effect of the heat dissipating patterned conductor 15.

In the above mentioned embodiments, the driver IC of the IC package having one IC chip mounted on one FPC has been described. It would be a matter of course to persons skilled in the art that the present invention can be applied to a driver IC having a plurality of IC chips mounted on one FPC. If a plurality of IC chips are mounted on one FPC, the area and the length of the FPC can be reduced, so that the cost of the PDP can be reduced.

In the above mentioned embodiments, the PDP is constituted of display cells formed by bonding a pair of glass plates to each other. However, the present invention can be similarly applied to a PDP constituted of transparent plates formed of materials other than the glass plates. In addition, the present invention is not limited to the PDP, and can be applied to the flat panel display of the other type such as an EL (electroluminescence) display, a LED display, and an EC display. Particularly, the present invention is effective if the present invention is applied to the flat panel display having a large load for the driver IC.

As mentioned above, according to the present invention, since the driver IC is tightly mounted on the surface of the transparent plate such as the rear glass plate constituting the display cells, when the heat generates in the IC chip of the driver IC, the heat stress is suppressed, and a crack is prevented from occurring in the IC chip. Since the IC chip is mounted on the surface of the transparent plate where the cell electrodes are formed, the difference in height between the electrode surface of the IC chip and the cell electrode surface is reduced, so that the bending amount of the FPC in the thickness direction can be minimized, and the size of the FPC can be shortened. Therefore, the driver IC can be microminiaturized and the cost of the driver IC can be lowered. The heat generated in the driver IC can be effectively dissipated through the heat dissipating patterned conductor formed on the transparent plate, so that an overheating of the driver IC can be presented, and therefore, reliability of the driver IC can be elevated. Thus, it is possible to obtain a small-size, high-reliability, flat panel display, in comparison with the prior art flat panel display having the driver ICs which are mounted on the metal reinforcement plate, or which includes the IC chip that is not tightly mounted on the transparent plate of the PDP.

The invention has thus been shown and described with reference to the specific embodiments. However, it should be noted that the present invention is in no way limited to the details of the illustrated structures but changes and modifications may be made within the scope of the appended claims.

What is claimed is:

1. A flat panel display comprising a plurality of display cells formed and arranged on a transparent plate, wherein a driver integrated circuit for driving said display cells is tightly mounted on said transparent plate, said driver integrated circuit having electrodes formed thereon, wherein a surface of said integrated circuit mounted on said transparent plate is different from the surface of said integrated circuit on which the electrodes are formed.

2. A flat panel display claimed in claim 1 wherein said transparent plate includes a display area where said display cells are formed and an extension extending outwardly from said display area, said driver integrated circuit being tightly mounted on said extension of said transparent plate.

3. A flat panel display claimed in claim 2 wherein said driver integrated circuit includes a flexible printed circuit and an integrated circuit chip mounted on said flexible printed circuit, said integrated circuit chip including electrodes formed on an upper surface thereof and connected to said flexible printed circuit, a rear surface of said integrated circuit chip being tightly mounted on said transparent plate.

4. A flat panel display claimed in claim 3 wherein cell electrodes for supplying a voltage to said display cells are formed on one surface of said transparent plate, and said driver integrated circuit is mounted on said one surface of said transparent plate and electrically connected to said cell electrodes through said flexible printed circuit.

5. A flat panel display claimed in claim 4 wherein a heat dissipating conductor film is integrally formed on said one surface of said transparent plate, and said integrated circuit chip is bonded on said heat dissipating conductor film.

6. A flat panel display claimed in claim 5 wherein said heat dissipating conductor film is formed of the same conducting film as that of said cell electrodes.

7. A flat panel display claimed in claim 5 wherein a metal reinforcement plate is backed to said transparent plate, said heat dissipating conductor film being heat-conductively coupled to said metal reinforcement plate through a heat conducting member.

8. A flat panel display claimed in claim 2 wherein said transparent plate is constituted of a first glass plate of a pair of glass plates which are bonded to each other to constitute a plasma display panel, said driver integrated circuit being mounted on a portion of a surface of said first glass plate opposing to a second glass plate of said pair of glass plates.

9. A flat panel display claimed in claim 8 wherein said second glass plate is a front glass plate on which scan electrodes and sustain electrodes are formed as cell electrodes, and said first glass plate is a rear glass plate on which data electrodes are formed as cell electrodes, and wherein at least one end of said rear glass plate in an extending direction of said data electrodes has an extension extending beyond said front glass plate, a driver integrated circuit for supplying a required voltage to said data electrodes is mounted on said extension of said rear glass plate.

10. A flat panel display claimed in claim 9 wherein said driver integrated circuit is packaged on said flexible printed circuit in the form of a tape carrier package structure or in the form of a chip on film structure.

11. A flat panel display claimed in claim 3 wherein said transparent plate is constituted of a first glass plate of a pair of glass plates which are bonded to each other to constitute a plasma display panel, said driver integrated circuit being mounted on a portion of a surface of said first glass plate opposing to a second glass plate of said pair of glass plates.

12. A flat panel display claimed in claim 11 wherein said second glass plate is a front glass plate on which scan electrodes and sustain electrodes are formed as cell electrodes, and said first glass plate is a rear glass plate on which data electrodes are formed as cell electrodes, and wherein at least one end of said rear glass plate in an extending direction of said data electrodes has an extension extending beyond said front glass plate, a driver integrated circuit for supplying a required voltage to said data electrodes is mounted on said extension of said rear glass plate.

13. A flat panel display claimed in claim 4 wherein said transparent plate is constituted of a first glass plate of a pair of glass plates which are bonded to each other to constitute a plasma display panel, said driver integrated circuit being mounted on a portion of a surface of said first glass plate opposing to a second glass plate of said pair of glass plates.

14. A flat panel display claimed in claim 13 wherein said second glass plate is a front glass plate on which scan electrodes and sustain electrodes are formed as said cell electrodes, and said first glass plate is a rear glass plate on which data electrodes are formed as said cell electrodes, and wherein at least one end of said rear glass plate in an extending direction of said data electrodes has an extension extending beyond said front glass plate, a driver integrated circuit for supplying a required voltage to said data electrodes is mounted on said extension of said rear glass plate.

15. A flat panel display claimed in claim 5 wherein said transparent plate is constituted of a first glass plate of a pair of glass plates which are bonded to each other to constitute a plasma display panel, said driver integrated circuit being mounted on a portion of a surface of said first glass plate opposing to a second glass plate of said pair of glass plates.

16. A flat panel display claimed in claim 15 wherein said second glass plate is a front glass plate on which scan electrodes and sustain electrodes are formed as said cell electrodes, and said first glass plate is a rear glass plate on which data electrodes are formed as said cell electrodes, and wherein at least one end of said rear glass plate in an extending direction of said data electrodes has an extension extending beyond said front glass plate, a driver integrated circuit for supplying a required voltage to said data electrodes is mounted on said extension of said rear glass plate.

17. A flat panel display claimed in claim 7 wherein said transparent plate is constituted of a first glass plate of a pair of glass plates which are bonded to each other to constitute a plasma display panel, said driver integrated circuit being mounted on a portion of a surface of said first glass plate opposing to a second glass plate of said pair of glass plates.

18. A flat panel display claimed in claim 17 wherein said second glass plate is a front glass plate on which scan electrodes and sustain electrodes are formed as said cell electrodes, and said first glass plate is a rear glass plate on which data electrodes are formed as said cell electrodes, and wherein at least one end of said rear glass plate in an extending direction of said data electrodes has an extension extending beyond said front glass plate, a driver integrated circuit for supplying a required voltage to said data electrodes is mounted on said extension of said rear glass plate.

19. A flat panel display claimed in claim 18 wherein said driver integrated circuit is packaged on said flexible printed circuit in the form of a tape carrier package structure or in the form of a chip on film structure.

20. A flat panel display claimed in claim 3 wherein said driver integrated circuit is packaged on said flexible printed circuit in the form of a tape carrier package structure or in the form of a chip on film structure.

* * * * *